United States Patent
Lo Giudice et al.

(10) Patent No.: US 8,376,237 B2
(45) Date of Patent: Feb. 19, 2013

(54) METHOD FOR BIASING AN EEPROM NON-VOLATILE MEMORY ARRAY AND CORRESPONDING EEPROM NON-VOLATILE MEMORY DEVICE

(75) Inventors: Gianbattista Lo Giudice, Pedara (IT); Enrico Castaldo, Catania (IT); Antonino Conte, Tremestieri Etneo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 214 days.

(21) Appl. No.: 12/885,028

(22) Filed: Sep. 17, 2010

(65) Prior Publication Data

US 2011/0068179 A1   Mar. 24, 2011

(30) Foreign Application Priority Data

Sep. 18, 2009   (EP) .................................... 09425359

(51) Int. Cl.
    *G06K 19/06*  (2006.01)
(52) U.S. Cl. ........................................ 235/492; 235/451
(58) Field of Classification Search .................. 235/492, 235/451; 711/103
    See application file for complete search history.

(56) References Cited

U.S. PATENT DOCUMENTS

| | | | |
|---|---|---|---|
| 5,532,915 A | 7/1996 | Pantelakis et al. | |
| 5,638,327 A * | 6/1997 | Dallabora et al. | 365/185.15 |
| 6,011,717 A | 1/2000 | Brigati et al. | |
| 6,097,631 A | 8/2000 | Guedj | |
| 6,188,609 B1 * | 2/2001 | Sunkavalli et al. | 365/185.22 |
| 6,590,810 B2 * | 7/2003 | Ha | 365/185.18 |
| 6,934,192 B2 | 8/2005 | Tailliet et al. | |
| 2002/0172075 A1 * | 11/2002 | Park et al. | 365/185.18 |
| 2005/0012134 A1 | 1/2005 | Masuoka et al. | |
| 2005/0094431 A1 | 5/2005 | Sato et al. | |
| 2008/0002474 A1 | 1/2008 | La Rosa | |
| 2009/0168532 A1 * | 7/2009 | Sel et al. | 365/185.17 |

FOREIGN PATENT DOCUMENTS

EP   0 616 333 A1   9/1994

* cited by examiner

*Primary Examiner* — Ahshik Kim
(74) *Attorney, Agent, or Firm* — Seed IP Law Group PLLC

(57) ABSTRACT

Described herein is a method for biasing an EEPROM array formed by memory cells arranged in rows and columns, each operatively coupled to a first switch and to a second switch and having a first current-conduction terminal selectively connectable to a bitline through the first switch and a control terminal selectively connectable to a gate-control line through the second switch, wherein associated to each row are a first wordline and a second wordline, connected to the control terminals of the first switches and, respectively, of the second switches operatively coupled to the memory cells of the same row. The method envisages selecting at least one memory cell for a given memory operation, biasing the first wordline and the second wordline of the row associated thereto, and in particular biasing the first and second wordlines with voltages different from one another and having values that are higher than an internal supply voltage and are a function of the given memory operation.

26 Claims, 12 Drawing Sheets

|  | ERASE SELECTED | ERASE UNSELECTED | PROGRAM SELECTED | PROGRAM UNSELECTED |
|---|---|---|---|---|
| WL_seltr | $HV_{p2}(10V)$ | $V_{ss}(5V)$ | $HV_{p1}(16V)$ | $V_{ss}(5V)$ |
| WL_bsw | $HV_{p1}(16V)$ | $V_{ss}(5V)$ | $HV_{p2}(10V)$ | $V_{ss}(5V)$ |
| BL | 0V | 0V | $V_{progr}(13V)$ | $V_{clamp}(6V)$ |
| Cgt | $V_{erase}(13V)$ | $V_{cgtr}(3V)$ | 0V | 0V |
| SL | 0V | 0V | $V_{clamp}(6V)$ | $V_{clamp}(6V)$ |

FIG. 9

METHOD FOR BIASING AN EEPROM NON-VOLATILE MEMORY ARRAY AND CORRESPONDING EEPROM NON-VOLATILE MEMORY DEVICE

BACKGROUND

1. Technical Field

The present disclosure relates to a method for biasing an EEPROM (Electrically Erasable and Programmable Read-Only Memory) non-volatile memory array, in its various operating conditions, and to a corresponding EEPROM non-volatile memory device.

2. Description of the Related Art

As is known, an EEPROM array is constituted by a plurality of memory cells, arranged aligned in rows and columns and connected to appropriate selection and biasing elements and stages, which enable programming (or writing), erasing, and reading thereof in respective operating conditions. Each memory cell is formed by a floating-gate transistor, and the operations of erasing and programming envisage the injection and, respectively, the extraction of electrical charges into/from the floating-gate terminal of the floating-gate transistor via the tunnel effect (Fowler-Nordheim effect). Programmed memory cells have a different threshold voltage from erased memory cells; the reading operation of the contents of the memory cells hence envisages application of an appropriate read biasing voltage to the floating-gate terminal of the respective floating-gate transistors (which has a value intermediate between the threshold-voltage values of programmed and erased memory cells), and determination, on the basis of the presence or absence of conduction of electrical current through the floating-gate transistors, of the state (programmed or erased) of the memory cells.

As illustrated schematically in FIG. 1, a typical EEPROM array, designated as a whole by 1, is constituted by a certain number Nwl of rows and Nwl wordlines 1a, each row provided with a wordline WL, i.e., a line of conductive material, typically metal, which extends horizontally along the entire row. Each row, e.g., the row 1b provided with WORDLINE [0] 1c, is made up of a certain number Nwords of words 1d, and each word is in turn made up of a certain number Nbits of memory cells 1e, each storing a respective bit according to the state (programmed or erased). Each row is moreover traversed by a certain number of source lines SL, which extend vertically along the entire extension of the columns of the array at given intervals, for example every two words, and by a plurality of gate-control lines Cgt, one for each word.

In greater detail, FIG. 2 shows the architecture of a portion of the EEPROM array 1, including two wordlines WL[n], WL[n+1], each of which comprising two words and two associated gate-control lines Cgt[i], Cgt[i+1].

The memory cells, designated by 2, which are aligned vertically along one and the same column, have drain terminals selectively connected to one and the same bitline BL, constituted by a metal line extending vertically parallel to the gate-control lines Cgt, through a respective selection transistor 3, of an NMOS type. The selection transistors 3 of one and the same row have gate terminals connected to one another by the respective wordline WL. Each selection transistor 3 moreover has its drain terminal connected to a respective bitline BL and its source terminal connected to the drain terminal of an associated memory cell 2.

The gate terminals of the memory cells 2 belonging to one and the same word are connected to one another via a horizontal connection line, selectively connected to a respective gate-control line Cgt via a byte switch 4, which is also constituted by a transistor of an NMOS type. Each byte switch 4 has its source terminal connected to the gate terminals of the memory cells 2 of the corresponding word, its drain terminal connected to the respective gate-control line Cgt, and its gate terminal connected to the wordline WL of the respective row. Consequently, in this architecture, the wordlines WL enable supply of the appropriate biasing voltages simultaneously to the gate terminals of all the byte switches 4 and of all the selection transistors 3 belonging to one and the same row of the memory array 1. Furthermore, byte switches 4 belonging to one and the same column have drain terminals connected to the same gate-control line Cgt.

Memory cells 2 that are aligned horizontally along one and the same row moreover have source terminals connected to one another, generally constituted by a single doped region diffused within a substrate of semiconductor material, in which the memory array 1 is provided, or else by individual diffusions (one for each memory cell) connected to one another by a line of conductive material, typically metal; vertical source lines (SL) contact these source diffusions, traversing them in a vertical direction, at predetermined intervals, for example every two words of the memory array 1.

In a way not illustrated herein, the EEPROM device, of which the memory array 1 forms part, comprises suitable biasing stages, which enable biasing with voltages of appropriate value (depending upon the operating conditions) of the various wordlines, bitlines, source lines, and gate-control lines of the memory array 1.

In particular, in use, the byte switches 4, appropriately biased by the respective wordlines WL, enable transfer of the biasing applied to the vertical gate-control lines Cgt to the gate terminals of the memory cells 2 of the respective word. The selection transistors 3, which are also appropriately biased by the respective wordline WL, enable transfer of the voltage applied to the vertical bitlines BL to the drain terminals of the respective memory cells 2.

In greater detail, during an erasing operation, the minimum erasable unit is constituted by a word of the memory array 1. With reference to FIG. 3, there is assumed, for example, erasing of the word biased by the wordline WL[n] and by the gate-control line Cgt[i].

To erase the memory cells 2 forming this word, an erasing voltage $V_{erase}$ is applied, typically of 13 V (in the case of 0.18 μm CMOS technology), between the gate and source terminals ($V_{Gs}=V_{erase}$), and between the gate and drain terminals ($V_{GD}=V_{erase}$) of the memory cells 2. Typically, and as illustrated in FIG. 3, the gate voltage is forced equal to the value of the erasing voltage ($V_G=V_{erase}$), whilst the source voltage is set to the ground voltage ($V_S=0$ V) so as to obtain the desired positive voltage $V_{GS}$. On account of this value of the voltage between gate and source, the channel of the floating-gate transistors of the memory cells 2 is formed, and, since no drain current is flowing, the drain voltage is equal to the source voltage so that $V_{GS}=V_{GD}=V_{erase}$, as desired.

Typically, to obtain erasing, the wordline WL[n] of the row to which the word to be erased belongs is biased at a first high voltage $HV_{p1}$, generated via a charge-pump circuit starting from an internal supply voltage of the memory device, having for example a value of 16 V (in general, meant by "high voltage" is a voltage that is higher than, and not comparable with, low or logic voltage values, and typically has values higher than 10V). Furthermore, the gate-control line Cgt[i] to which the word is associated is set to the erasing voltage $V_{erase}$, whilst the source line SL is set to ground (0 V). The bitlines BL are instead left floating (or at a high impedance). The wordlines WL, as likewise the gate-control lines Cgt, not selected for the erasing operation, are set to ground.

In these biasing conditions, the byte switch 4 thus transfers to the gate terminals of the memory cells 2 of the word to be erased the erasing voltage $V_{erase}$ present on the gate-control line Cgt[i] (thanks to the presence of the first high voltage $HV_{p1}$ on the corresponding control terminal, of a value sufficiently higher than the same erasing voltage $V_{erase}$).

During a programming operation, the minimum programmable unit is instead constituted by the individual bit so that it is possible to program in the desired state each individual memory cell 2. With reference to FIG. 4, it is assumed for example to program the word biased by the wordline WL[n], by the gate-control line Cgt[i], and by the bitline BL[0].

To program this memory cell 2 a programming voltage $V_{prog}$ is applied, typically equal to 13 V (once again in the case of CMOS technology at 0.18 μm), between the drain and gate terminals ($V_{DG}=V_{prog}$), leaving the source terminal floating. In the practical common implementation, the biasing voltage $V_{prog}$ is forced on the drain terminal ($V_D=V_{prog}$), whilst the gate terminal is brought to ground ($V_G=0$ V). For this purpose, the wordline WL[n], to which the memory cell 2 is coupled, is biased at the first high voltage $HV_{p1}$, for example once again equal to 16 V; the corresponding gate-control line Cgt[i] is set to ground (0 V); the bitline BL[0] associated to the memory cell 2 is set to the programming voltage $V_{prog}$; and the source line SL is left floating. In this biasing condition, the gate terminal of the memory cell 2 to be programmed is brought to the voltage present on the gate-control line Cgt[i], via the byte switch 4 (which is set in a conduction condition by the first high voltage $HV_{p1}$ present on the corresponding control terminal), and the programming voltage $V_{prog}$ on the bitline BL[0] is transferred onto the drain terminal of the same memory cell 2, via the corresponding selection transistor 3, which is also set in a conduction condition by the biasing voltage of the associated wordline WL[n]. Once again, both the wordlines WL and the gate-control lines Cgt of the memory cells 2 not selected are set to ground, whilst the corresponding bitlines BL are left floating.

The memory cells 2 of the memory array 1 are in this way subjected to several work cycles, which cause, with the passage of time, an intrinsic reduction of the efficiency of the erasing and programming operations. In particular, phenomena of charge trapping and of natural ageing of the floating-gate transistors of the memory cells 2 cause a modification in time of the values of the threshold voltages of the erased and programmed memory cells.

In detail, as illustrated in FIG. 5 by a solid line, the threshold voltage $V_{t\_e}$ of the erased memory cells decreases, whilst the threshold voltage $V_{t\_p}$ of the programmed memory cells has a corresponding growth, as the work cycles increase. A reduction of the opening of the programming/erasing "window" consequently occurs in time, caused by the approach of the values of the different threshold voltages of the programmed and erased memory cells, with the consequent possibility of reading errors and malfunctioning of the memory.

In particular, to aggravate this natural phenomenon of ageing of the memory cells 2, the biasing architecture previously described, typically used in prior art EEPROMs, leads to further stresses in the selection transistors 3 and in the byte switches 4, which cause electrical stresses at the gate terminals and an increase of the charge trapping in the oxides.

Basically, as illustrated in FIG. 5 by a dashed line, this biasing architecture leads to a further reduction of the programming/erasing window, which thus further adds to the intrinsic reduction presented by the memory cells subjected to several work cycles.

U.S. Pat. No. 6,934,192 describes a different architecture of an EEPROM array, which differs from the one previously illustrated on account of the presence of two distinct wordlines for each row of the memory array.

In particular, as illustrated in FIG. 6, in the memory array, designated here by 10, associated to each row is a first wordline, designated by WL_seltr, connected to which are the gate terminals of the selection transistors 3, and a second wordline, designated by WL_bsw, distinct and separate from the first wordline WL_seltr, connected to which are the gate terminals of the byte switches 4. The use of two wordlines for each row is described in the aforesaid document for the purposes of protection of the memory array 10 from the effects of a possible breakdown of the selection transistors 3 during the erasing operations, due to the possible failure of the gate oxides, in particular in such a way as to confine the effects of this breakdown to the individual memory cell subjected to failure, without involving other adjacent memory cells.

The two wordlines are biased at the same voltage during the reading and programming operations, whilst they are instead biased at different voltages during erasing, during which the first wordline WL_seltr is brought to the same voltage as the source terminal of the selection transistor 3 (i.e., to ground), whilst the second wordline WL_bsw is brought to the first high voltage $HV_{p1}$. In this way, a possible breakdown of the selection transistor 3 (with a consequent short-circuit between the corresponding gate and source terminals) does not cause collapse towards ground of the output of the charge-pump circuit (which continues to supply at output the first high voltage $HV_{p1}$) and the consequent impossibility of continuing the erasing procedure of the other memory cells 2 of the same word; in fact, a localized error occurs in the memory cell 2 that has undergone the breakdown phenomenon.

The known architecture of the memory array described above consequently aims at confining the effects of a breakdown (already occurred) in a single memory cell 2 or at the most in a limited number of them, but does not enable reduction beforehand of the possibility of said breakdown occurring. In particular, no solutions are described that are useful for reducing the electrical stresses acting on the transistors of the memory array 10 and hence preventing breakdown phenomena.

BRIEF SUMMARY

Some embodiments include a memory array and a corresponding biasing scheme that enable reduction of the stresses acting on the memory cells 2 and the consequent possibility of breakdown and errors occurring as the number of work cycles increases.

A method is provided for biasing an EEPROM array. For example, the EEPROM array may include a plurality of memory cells arranged in rows and columns, each of said memory cells having a first current-conduction terminal coupled to a bitline of said EEPROM array through a first switch and a control terminal coupled to a gate-control line of said memory array through a second switch. A control terminal of the first switch is coupled to a first wordline and a control terminal of the second switch is coupled to a second wordline. The biasing may include selecting at least one memory cell for a memory operation, the memory operation being a programming operation or an erasing operation. The selecting may include biasing the first wordline and the second wordline with voltages generated starting from an internal supply voltage. The biasing may include biasing said first wordline and said second wordline with voltages different from one another and having values that are higher than said internal supply voltage and are a function of the memory operation for each of said operations of programming and erasing. The values are chosen in such a way as to limit electrical stresses in said EEPROM array.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIG. 9 shows a table that gives exemplary values of the biasing voltages used;

DETAILED DESCRIPTION

Figure 1:
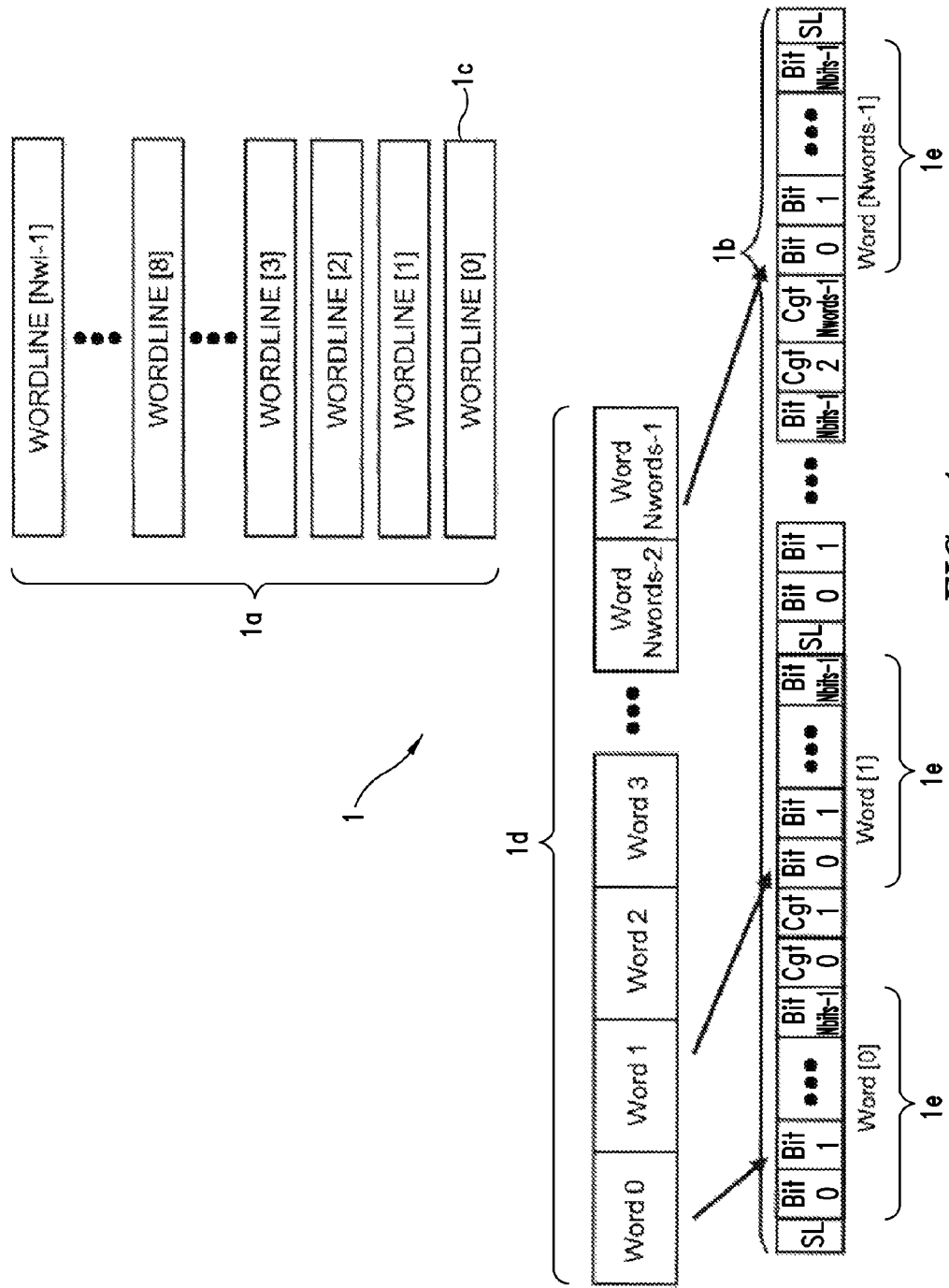
FIG. 1 is a schematic representation of the contents of an EEPROM array of a known type.
Figure 2:
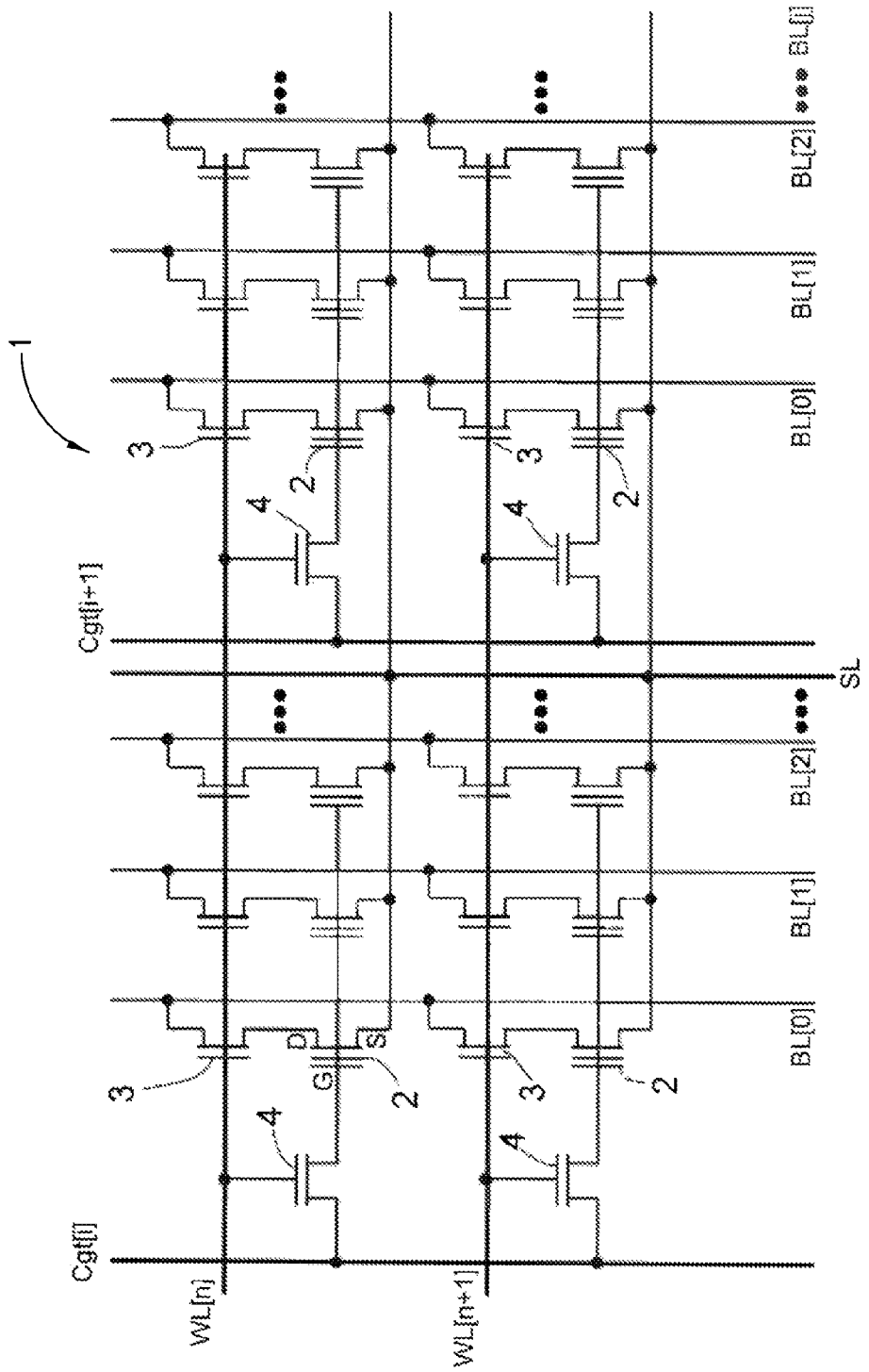
FIG. 2 shows the architecture of a portion of the memory array of a known type of FIG. 1.
Figure 3:
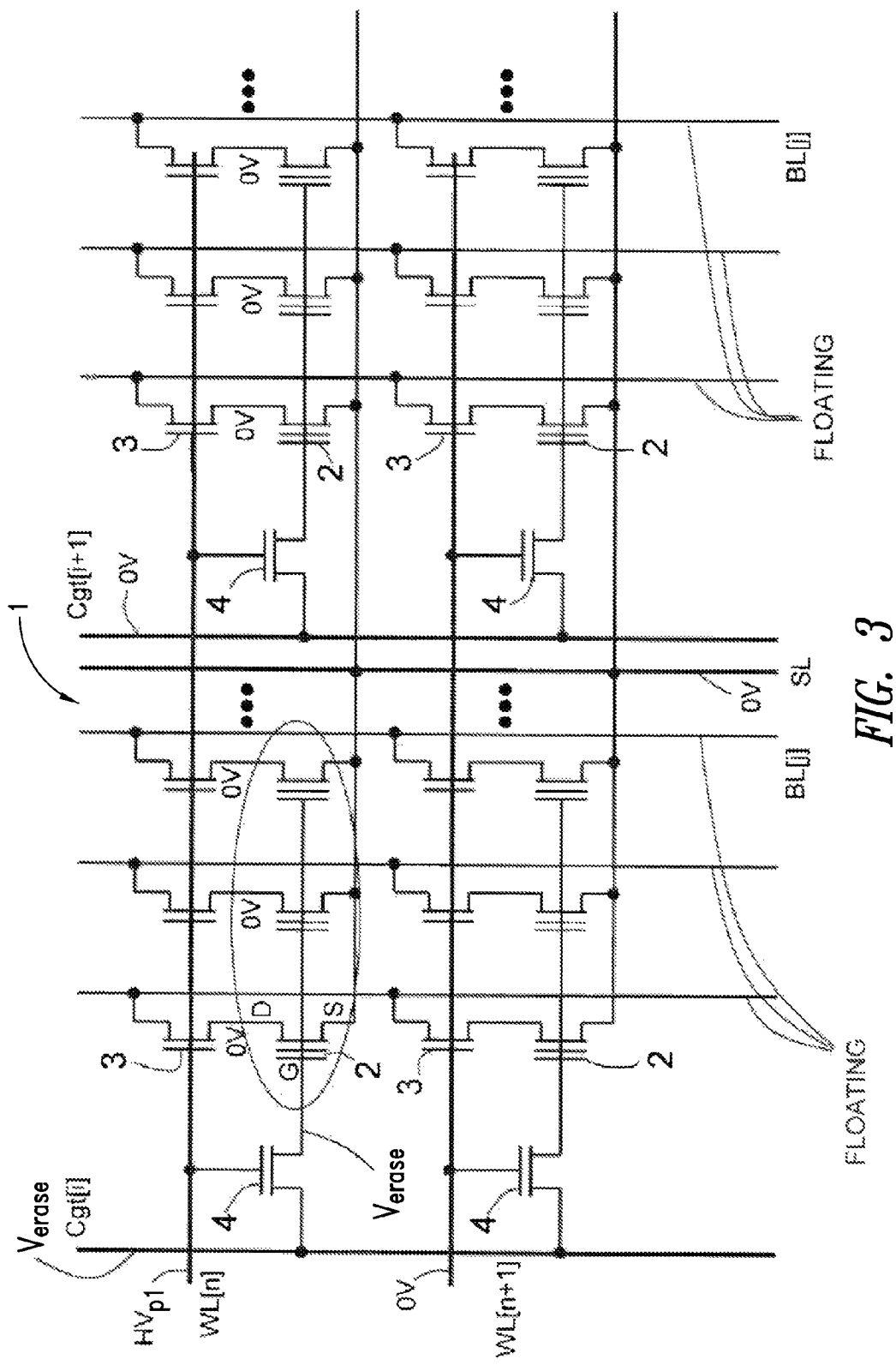
FIGS. 3 and 4 show the portion of the memory array of FIG. 2, during an erasing operation and a programming operation, respectively.

The present applicant has identified the following problems that afflict the erasing operations in a traditional biasing scheme (see once again FIG. 3):

electrical stresses occur on the gate terminals of the byte switches 4 of the words not selected for the erasing operation in the selected wordline WL (these gate terminals have in fact a voltage $V_{GS}$ equal to the first high voltage $HV_{p1}$, i.e., equal to 16 V);

electrical stresses also occur on the gate terminals of all the selection transistors 3 associated to the memory cells 2 of the selected wordline (in so far as they also have a voltage $V_{GS}$ equal to the first high voltage $HV_{p1}$);

the upper limit of the voltage level applicable to the gate-selected control lines Cgt is in any case limited by the breakdown voltage of the drain-gate junctions of the byte switches 4 of the non-selected rows (on which the entire erasing voltage $V_{erase}$ of the same gate-control lines Cgt is present).

Figure 4:
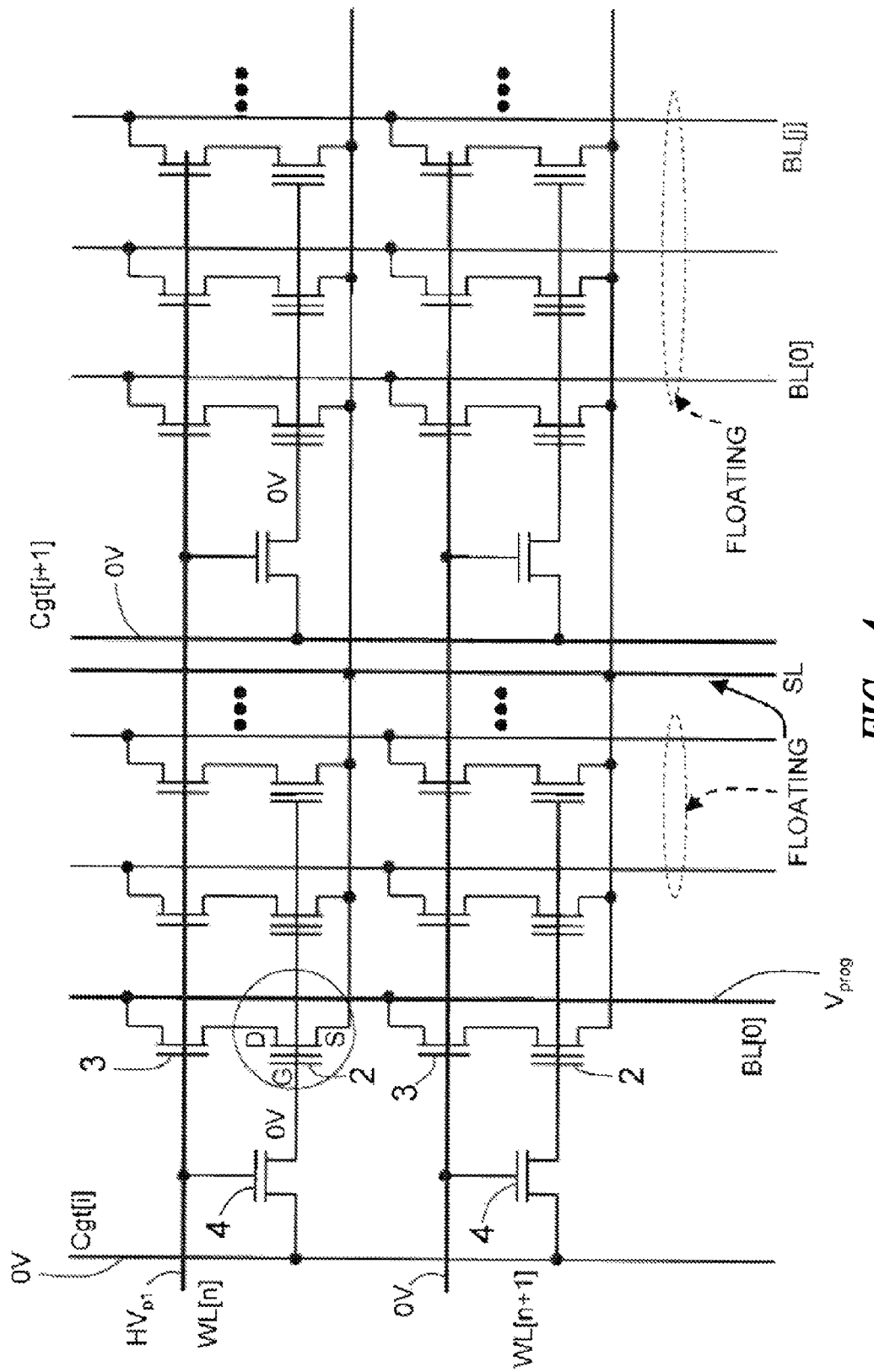

The present applicant has moreover identified the following problems that afflict the programming operations in the aforesaid traditional biasing architecture (see FIG. 4):

electrical stresses occur on the gate terminals of the byte switches 4 both of the words being programmed and of the words that are not being programmed but are on the same selected row, in so far as both the gate-drain junction and the gate-source junction go to a voltage value equal to the first high voltage $HV_{p1}$ ($V_{GD}=V_{GS}=16$ V);

electrical stresses occur on the gate terminals of the selection transistors 3 of the memory cells 2 not selected for programming on the same row of a memory cell being programmed, in so far as these transistors have on their gate terminal the first high voltage $HV_{p1}$;

channel currents are generated in the memory cells 2 during programming on account of the high electrical fields to which they are subjected; in fact, during programming, the threshold voltage decreases until it becomes even negative, so that, notwithstanding the fact that the corresponding gate terminal remains at a voltage of 0 V, the memory cells can conduct an electric current; this electrical current can thus charge the parasitic capacitance of the source line SL and cause charge trapping in the gate oxides, with the consequence of altering the programming/erasing efficiency, changing the gain and modifying the threshold voltage of the memory cells 2 when the charges trapped are released;

the upper limit of the voltage level applicable to the bitline BL of the memory array, equal to the programming voltage $V_{prog}$, is in any case limited by the breakdown voltage of the drain junctions (for example, $V_{DG}=13$ V) of the selection transistors 3 associated to the memory cells 2 of the non-selected rows and belonging to the same column of a selected cell.

Figure 5:
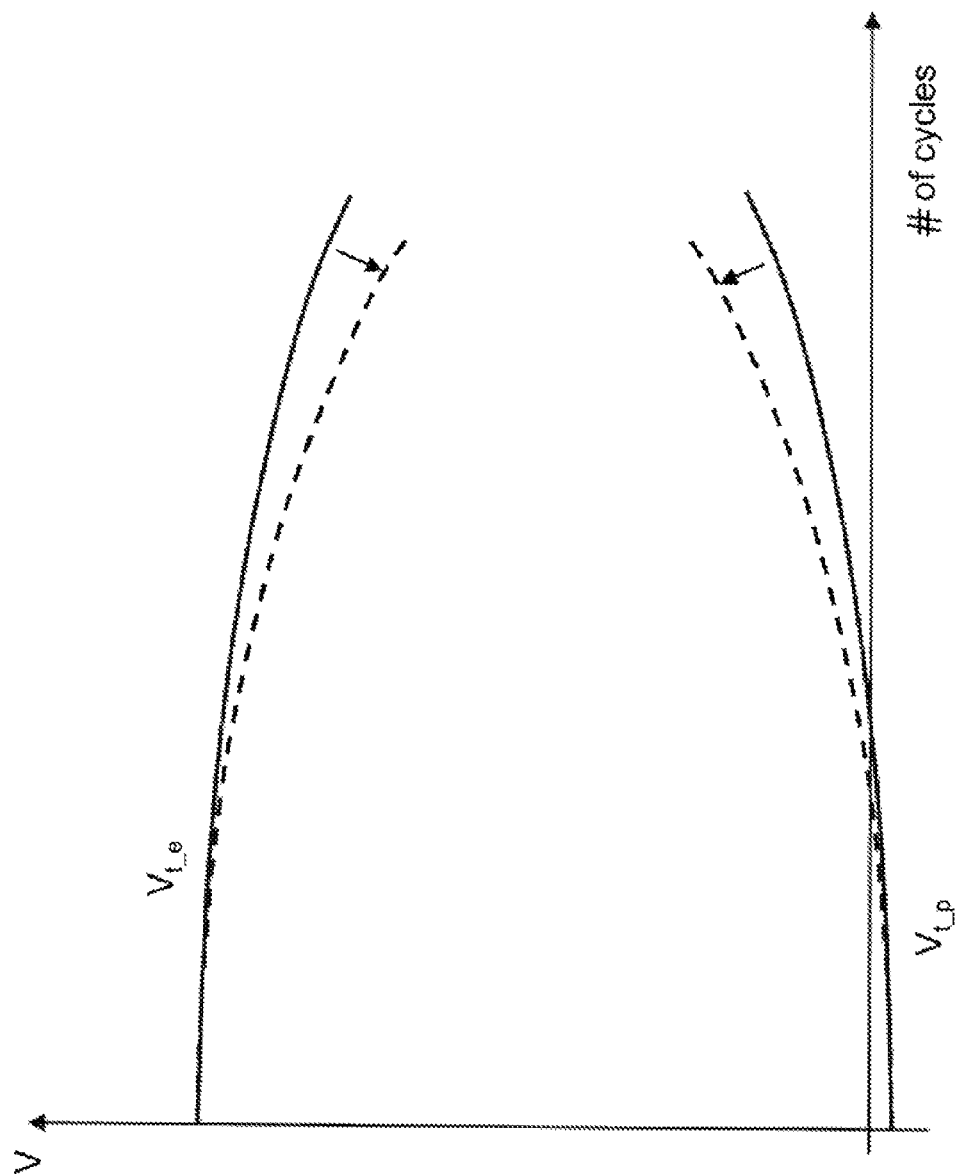
FIG. 5 shows a graph relating to a degradation in the electrical characteristics of the memory cells caused by ageing and electrical stresses.

Accordingly, it can in general be stated that the set of the problems referred to above determines a sensible worsening of the electrical characteristics of the memory cells 2, with the passing of time, and in particular the reduction of the useful window for programming/erasing, as the number of the work cycles increases (as illustrated in FIG. 5).

Figure 6:
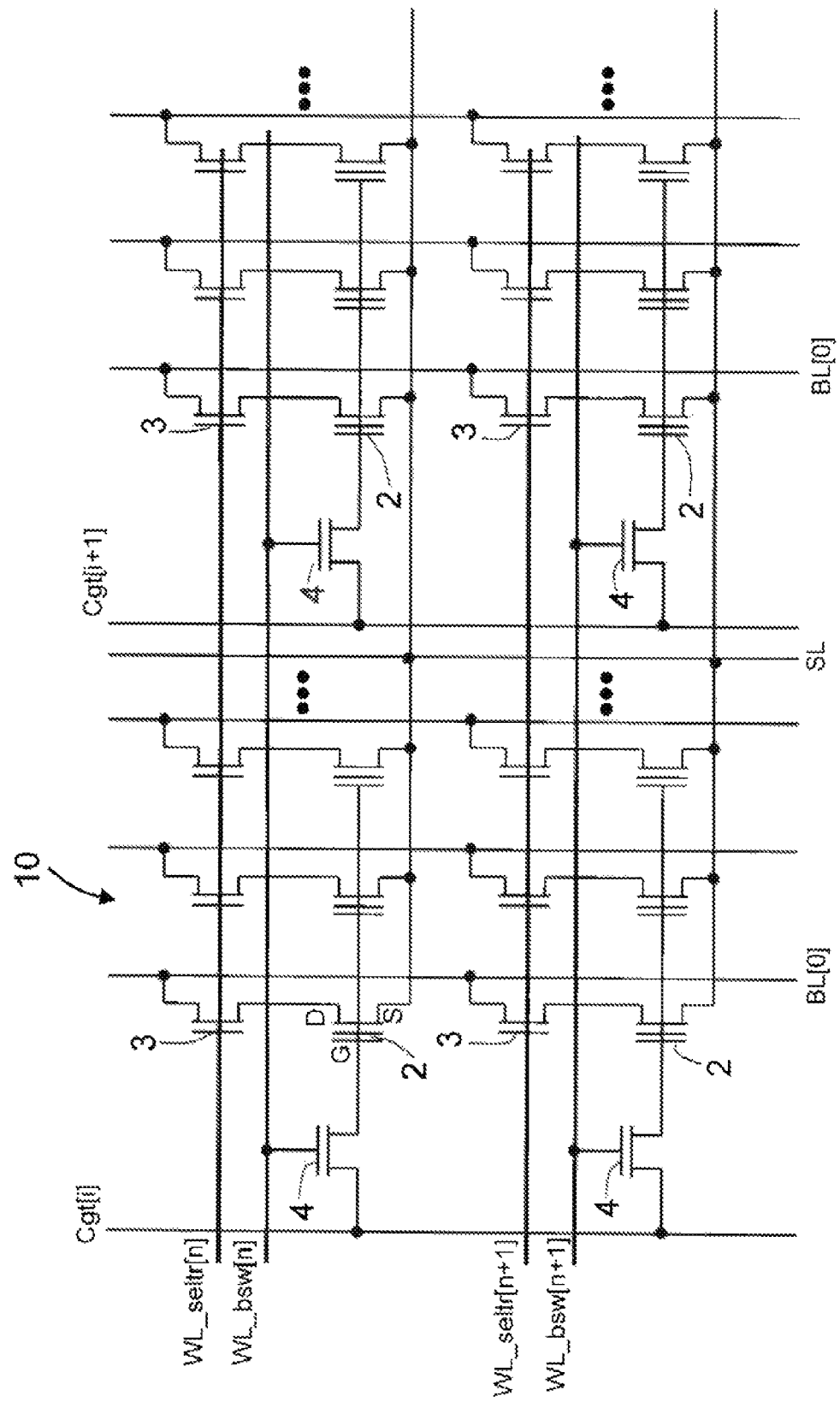
FIG. 6 shows the architecture of a portion of a further memory array of a known type.

In order to overcome these problems either totally or in part, according to an embodiment the use is described of a memory array, once again designated by 10, having a structure similar to the one described with reference to FIG. 6 and to document U.S. Pat. No. 6,934,192, i.e., envisaging the use of two distinct wordlines for each row, combined to an appropriate biasing scheme that envisages biasing at voltages of desired and controlled value, depending upon the operating phase, of substantially all the electrical lines of the memory array.

Figure 7:
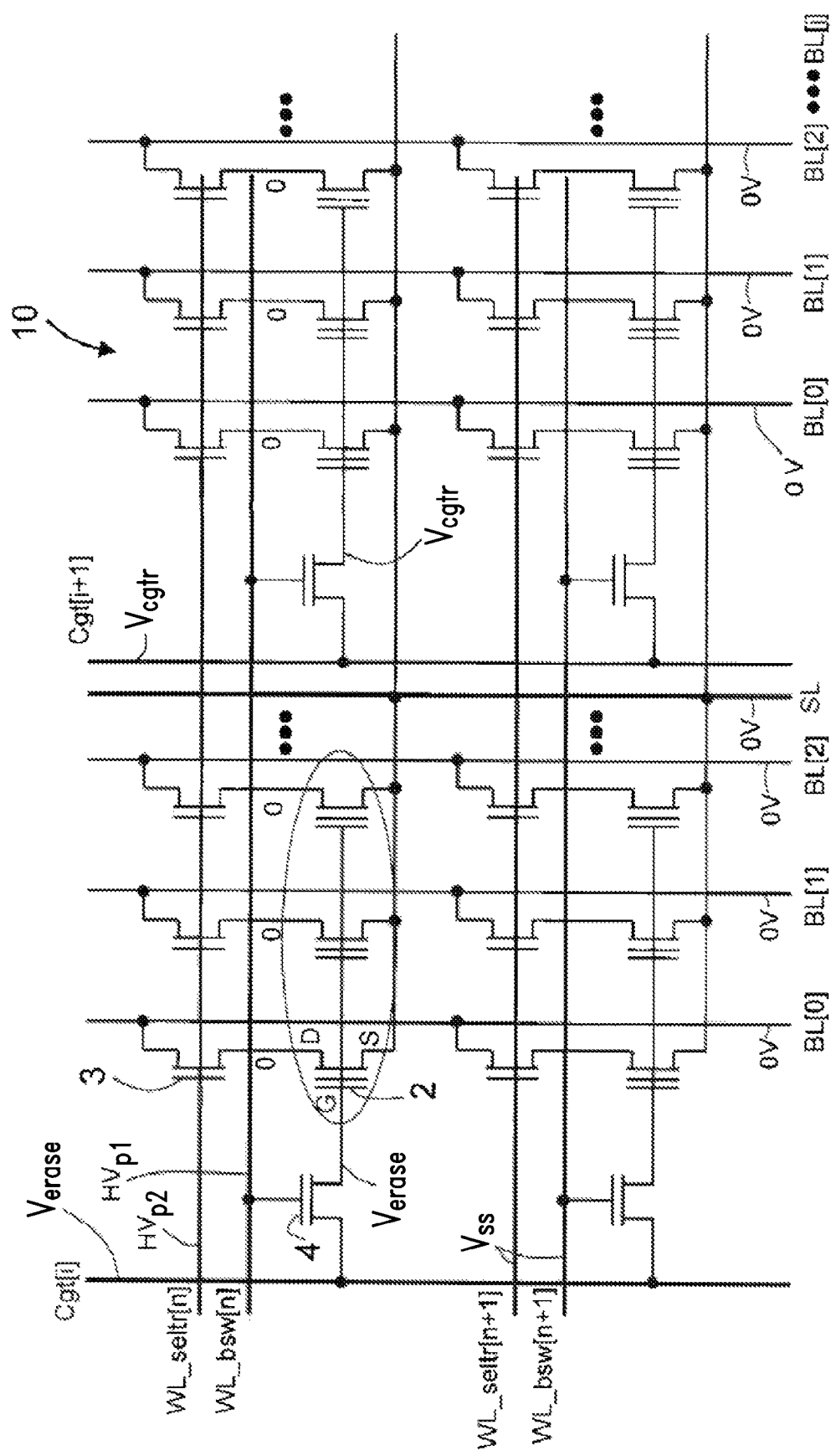

In detail, and with reference to FIG. 7, during an operation of erasing of one or more words of the memory array 10 (in the case illustrated of the word associated to the wordline WL_seltr[n] and WL_bsw[n] and to the gate-control line Cgt[i]), the use is described of the following biasing voltages, the values of which differ from a traditional biasing scheme (note that biasing values that are equal to the ones already used in the known scheme are not described again):

the first wordline WL_seltr of a selected row is biased at a voltage value lower than the first high voltage $HV_{p1}$, in particular at a second high voltage $HV_{p2}$, which is also higher than the logic supply voltage, for example of a value comprised between 8 V and 10 V ($8 V \leq HV_{p2} \leq 10 V$), for example 10 V;

the second wordline WL_bsw of a selected row is biased at a voltage value different from the first wordline WL_seltr, at the first high voltage $HV_{p1}$, having a value for example comprised between 14 V and 16 V ($14 V \leq HV_{p1} \leq 16$ V), for example approximately 16 V (in the case where the erasing voltage $V_{erase}$ is equal to 13 V; it is desirable in fact that the level of the first high voltage $HV_{p1}$, depending upon the technology used should be such that, when applied to the gate of the byte switches 4, will enable transfer of the erasing voltage $V_{erase}$ from the gate-control line Cgt to the gate terminal of the memory cells 2);

the gate-control lines Cgt not selected (i.e., that are not associated to any word subjected to erasing) are biased at a gate-control reference voltage $V_{cgtr}$, having a value different from and higher than 0 V, for example comprised between 0 V and 5 V (0 V<$V_{cgtr}$≦5 V), for example 3 V;

the bitlines BL selected (i.e., that are associated to memory cells 2 of the words subjected to erasing) are set at a reference voltage, for example at the ground voltage (0 V), instead of being left floating; in the same way, the bitlines BL not selected are also connected to ground;

the first wordline WL_seltr and the second wordline WL_bsw of the non-selected rows (i.e., that do not comprise any word subjected to erasing) are biased at a row reference voltage $V_{SS}$, of a (positive) logic value, for example comprised between 3 V and 5 V (3 V≦$V_{SS}$≦5 V), for example 5 V.

Using the biasing scheme described herein, during an erasing operation it is hence possible to use biasing voltages that enable:

reduction of the voltage across the gate oxides of the selection transistors 3 of the words not selected for erasing belonging to a selected row (equal to the second high voltage $HV_{p2}$, for example 10 V, instead of the first high voltage $HV_{p1}$, for example 16 V); in this regard, it is possible to bias the gate of these not selected selection transistors 3 also at voltages lower than the first high voltage $HV_{p1}$, given that they need not transfer to the memory cells 2 any specific value of biasing voltage;

reduction of the voltage across the gate oxides of the byte switches 4 of the words not selected belonging to the selected row, the value of which is equal to the difference between the value of the first high voltage $HV_{p1}$ and the value of the gate-control reference voltage $V_{cgtr}$, on the not selected gate-control lines Cgt, being hence for example equal to 13 V, instead of being equal to the first high voltage $HV_{p1}$.

Consequently, this biasing scheme advantageously enables reduction of the electrical stresses of the gate terminals during the erasing operations, and thus increase in the breakdown voltages of the selection transistors 3 and of the byte switches 4 of the memory array 10.

The aforesaid biasing values have been selected on the basis of the studies and the tests conducted by the applicant on EEPROM storage devices, and are the result of a compromise between the reduction of the electrical stresses in the memory array 10 and the desire to respect boundary conditions dictated by circuit components operatively associated to the same memory array 10 (these values also depend, as it will be clear, on the type of technology used for the memory array).

In particular, the value of the second high voltage $HV_{p2}$ is chosen so as to be sufficiently lower than the value of the first high voltage $HV_{p1}$ (and thus limit effectively the stresses on the gate terminals of the selection transistors 3), but still sufficiently higher than logic voltage values (which are, for example, around 5 V) and in particular than the row reference voltage $V_{SS}$, for reasons that will be clarified hereinafter and that derive from the circuit structure of the row decoder associated to the memory array 10.

The values of the row reference voltage $V_{SS}$ and of the gate-control reference voltage $V_{cgtr}$ are chosen in such a way as to increase advantageously the breakdown voltage of the byte transistors 4 and of the selection transistors 3; however, the value of these voltages has an upper limit that is determined by the desire to prevent soft-erasing and soft-programming (when applied to the byte switches 4 and to the selection transistors 3 of cells not selected).

Figure 8:
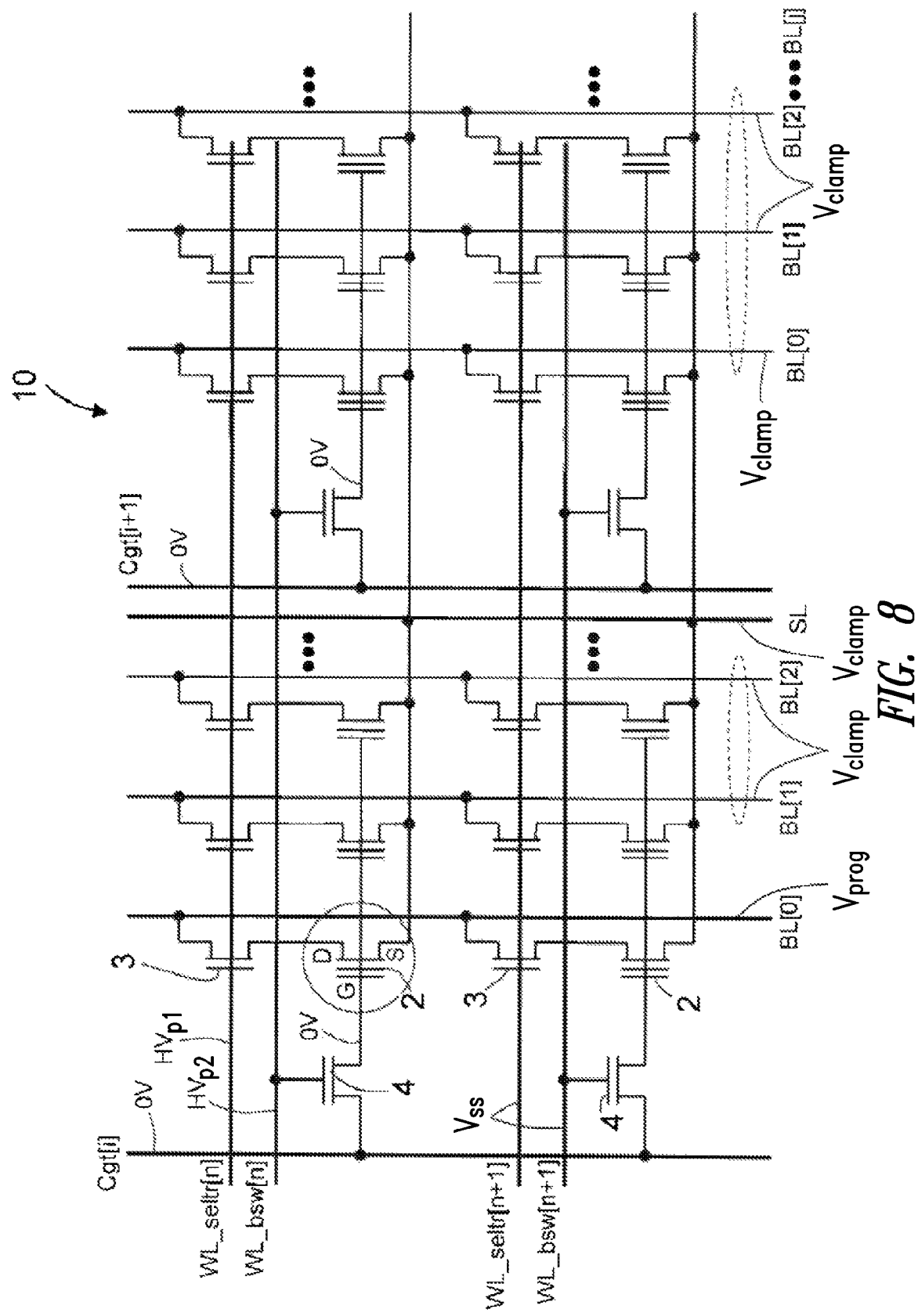
FIG. 8 show a biasing scheme applied to an EEPROM array according to an embodiment, during an erasing operation and a programming operation, respectively.

With reference now to FIG. 8, during a programming operation of one or more memory cells 2 of the memory array 10 (in the case illustrated of the memory cell associated to the wordlines WL_seltr[n] and WL_bsw[n], to the gate-control line Cgt[i] and to the bitline BL[0]), the use is also described of the following biasing voltages, the values of which differ from a traditional biasing scheme (note that once again biasing values that are equal to the ones used in the known biasing scheme are not described):

the first wordline WL_seltr of a selected row is biased at the first high voltage $HV_{p1}$;

the second wordline WL_bsw of a selected row is biased at a voltage value lower than the first high voltage $HV_{p1}$, in particular at the second high voltage $HV_{p2}$;

the source lines SL of the memory array 10, instead of being left floating, are biased at a controlled-voltage value, in particular at a positive clamp voltage $V_{clamp}$, for example 6 V;

the bitlines BL not selected are biased at the same value at which the source lines SL are biased, i.e., at the clamp voltage $V_{clamp}$, for example 6 V;

the first wordline WL_seltr and the second wordline WL_bsw of the non-selected rows are biased, also in this case, at the row reference voltage $V_{SS}$.

Using the biasing scheme described herein, during a programming operation it is possible to use biasing voltages that enable:

reduction of the gate voltages of the byte switches 4 of the words being programmed ($V_{GD}=V_{GS}=HV_{p2}$, for example 10 V instead of 16V);

reduction of the gate voltages of the byte switches 4 of the words on the same selected row, but not being programmed ($V_{GD}=V_{GS}=HV_{p2}$, for example 10 V instead of 16V);

reduction of the gate voltages of the selection transistors 3 of the memory cells 2 not selected for programming belonging to a selected row ($V_{GD}=V_{GS}=HV_{p1}-V_{clamp}$, for example 10 V instead of 16 V); and elimination of the flow of current through possible "depleted" memory cells (i.e., ones having a threshold voltage that has become negative), thanks to the biasing of the not selected bitlines BL at the same voltage value as the source line SL.

Once again, the given biasing values depend also upon the technology used and the possible desire to respect boundary conditions dictated by circuit components operatively associated to the memory array 10. In particular, the value of the clamp voltage $V_{clamp}$ is chosen according to the technology used (for example, it is comprised between 3 V and 7 V), in order to prevent channel current from flowing through the cell during programming (which can thus become depleted) or through cells not selected but already depleted.

The table of FIG. 9 hence sums up the biasing scheme described herein for the operations of erasing and programming, distinguishing selected lines from non-selected lines; the numerical values of the example discussed previously are shown in brackets.

As may be noted, all the lines of the memory array 10 are biased at definite voltages, of appropriate and controlled value, so as to obtain the effects described previously of:

raising of the breakdown voltages of the selection transistors 3 and of the byte switches 4;

reduction of the electrical gate stress of the same selection transistors 3 and byte switches 4; and elimination of the channel current through the memory cells 2 during the programming operations.

A description is now made of the architecture of an EEPROM device incorporating the memory array 10, with particular reference to the stages and to the elements that enable generation and supplying of the desired biasing voltages to the various lines of the memory array 10.

Figure 10:
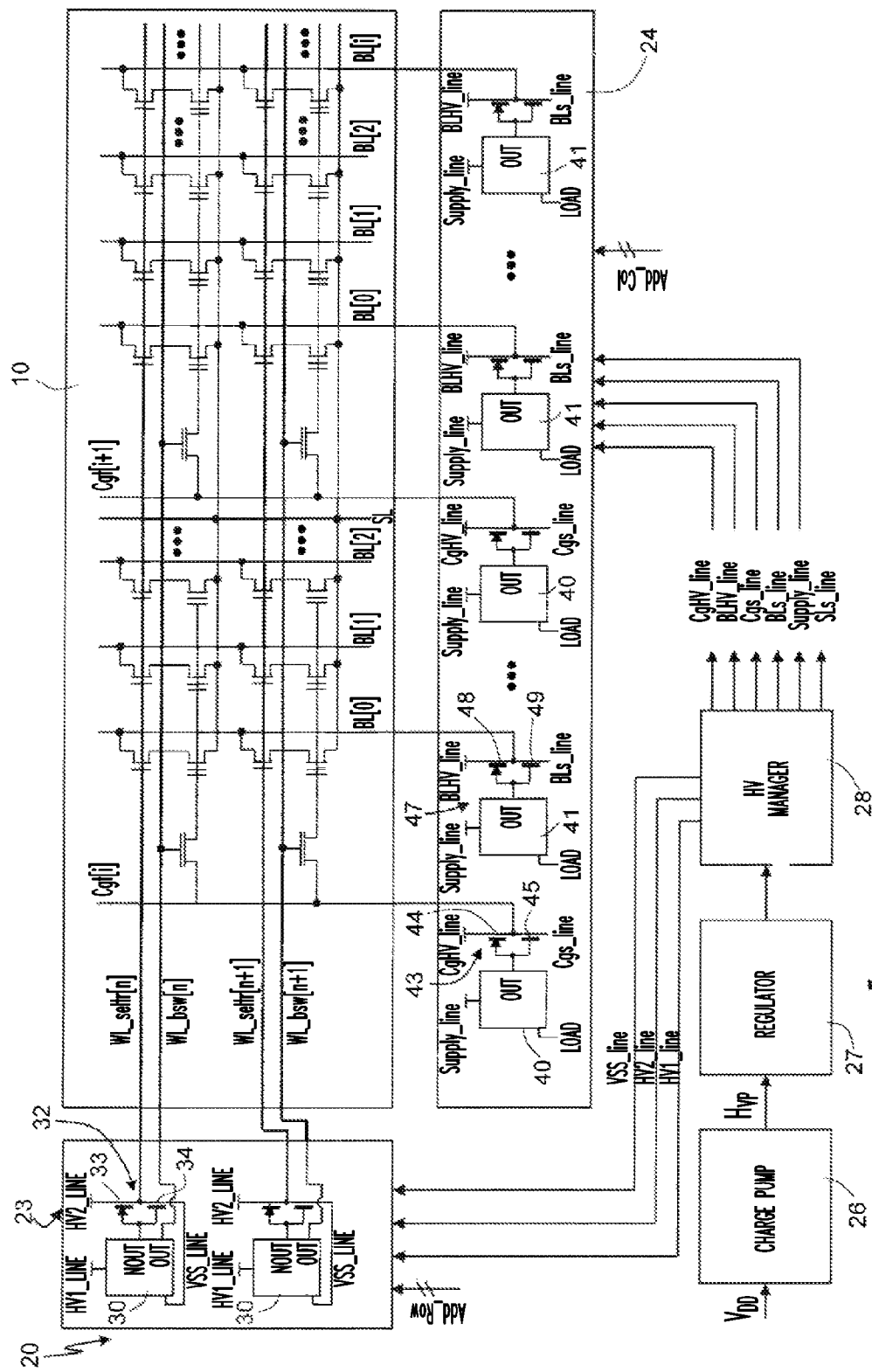
FIG. 10 shows a block diagram of a portion of a memory device incorporating the EEPROM array, according to a further aspect of an embodiment.

In detail, and with reference to FIG. 10, the EEPROM device, designated by 20 (and of which only the stages relevant for the present biasing architecture are illustrated), comprises: a charge-pump stage 22, designed to generate the various biasing voltages desired for the operations on the memory array 10, starting from an internal supply voltage $V_{DD}$, for example comprised between 1 V and 1.35 V; a row-decoder stage 23, connected to the charge-pump stage 22, from which it receives the appropriate biasing voltages, and to the memory array 10 for biasing of the first and second wordlines WL_seltr, WL_bsw; and a column-latch stage 24, connected to the charge-pump stage 22, from which it receives the appropriate biasing voltages, and to the memory array 10 for biasing of the gate-control lines Cgt and of the bitlines BL.

In particular, the charge-pump stage 22 includes: a charge-pump circuit 26, of a per-se known type, which receives the internal supply voltage $V_{DD}$ and supplies a boosted output voltage $HV_p$; a voltage regulator 27, which receives the boosted voltage $HV_p$ and is configured so as to generate (for example, by means of a series of resistive or capacitive divisions or divisions of some other nature) the appropriate biasing-voltage values for the operations on the memory array 10 starting from the same boosted voltage $HV_p$ and a management unit 28, which receives the biasing-voltage values generated by the voltage regulator 27 and, according to the operating condition of the memory (programming or erasing), supplies at output the desired values on the following output-biasing lines (connected, as will be described hereinafter, to the row-decoder stage 23 or to the column-latch stage 24): a first row high-voltage line HV1_line and a second row high-voltage line HV2_line; a row reference line VSS_line; a gate-control high-voltage line CgHV_line; a bitline high-voltage line BLHV_line; a gate-control reference line Cgs_line; a bitline reference line BLs_line; a latch supply line Supply_line; and a source-line reference line SLs_line.

The row-decoder stage 23 receives at input row-address signals Add_Row, and comprises a plurality of level shifters 30, one for each row of the memory array 10.

Each level shifter 30, having a circuit structure of a per-se known type (not described in detail herein), has: a high-voltage input connected to the first row high-voltage line HV1_line; a reference input connected, according to an embodiment, to the row reference line VSS_line (instead of to the ground voltage); and a first output Out, connected to the second wordline WL_bsw, on which it can supply alternatively (as a function of the row-address signals Add_Row, and of the possible request for selection, or otherwise, of the corresponding row) the biasing voltage value received on the first row high-voltage line HV1_line, or the voltage value received on the row reference line VSS_line. According to a further an embodiment, each level shifter 30 moreover has a second output Nout, connected to the first wordline WL_seltr via interposition of a CMOS inverter 32; the second output Nout also has, alternatively, the biasing voltage value received on the first row high-voltage line HV1_line or the voltage value received on the row reference line VSS_line, in a manner negated with respect to the first output Out.

The CMOS inverter 32 has: a control terminal connected to the aforesaid second output Nout; a supply terminal connected to the second row high-voltage line HV2_line; a reference terminal connected to the row reference line VSS_line; and an output connected to the first wordline WL_seltr, on which it supplies, alternatively, the biasing voltage value received on the second row high-voltage line HV2_line or the voltage value received on the row reference line VSS_line. In greater detail, the CMOS inverter 32 comprises a PMOS transistor 33 and an NMOS transistor 34, which have their gate terminals in common and connected to the second output NOut, and drain terminals in common and connected to the first wordline WL_seltr. The source terminal of the PMOS transistor 33 is moreover connected to the second row high-voltage line HV2_line, whilst the source terminal of the NMOS transistor 34 is connected to the row reference line VSS_line.

In particular, it is clear that this circuit configuration entails biasing of the first wordline WL_seltr and of the second wordline WL_bsw either at high voltage values (chosen between the first high voltage $HV_{p1}$ and the second high voltage $HV_{p2}$), which are different from one another, or simultaneously at the row reference voltage $V_{SS}$. It is also evident that, in order for this operation to be ensured, it is desirable that the condition $HV_{p2} > V_{SS}$ is to be met; i.e., it is desirable for the value of the second high voltage $HV_{p2}$ to be sufficiently higher than the row reference voltage $V_{SS}$.

The column-latch stage 24 comprises a plurality of latches, and in particular a gate-control latch 40 for each gate-control line Cgt of the memory array 10, and a bit-control latch 41, for each bitline BL of the same memory array 10.

Each gate-control latch 40 has: a loading input, designated by Load, connected to a data bus (not illustrated) containing the data to be programmed in the memory array 10 and receiving a respective bit; a supply input, connected to the latch supply line Supply_line; and an output Out' connected to a respective gate-control line CGT via interposition of an inverter 43, made by a PMOS transistor 44 and by an NMOS transistor 45. The PMOS transistor 44 and the NMOS transistor 45 of the inverter 43 have gate terminals connected together and to the output of the gate-control latch 40, and drain terminals connected together and to the respective gate-control line CGT; moreover, the source terminal of the PMOS transistor 44 is connected to the gate-control high-voltage line CgHV_line, whilst the source terminal of the NMOS transistor 45 is connected, according to an embodiment, to the gate-control reference line Cgs_line. In this way, the gate-control latch 40 biases the respective gate-control line CGT alternatively at the biasing voltage value received on the gate-control high-voltage line CgHV_line or on the gate-control reference line Cgs_line (in either case, at a desired and controlled value).

In turn, each bit-control latch 41 has: a respective loading input, which is also designated by Load, connected to the data bus containing the data to be programmed in the memory array 10 and receiving therefrom a respective bit; a supply input, connected to the latch supply line Supply_line; and an output, which is also designated by Out', connected to a respective bitline BL via interposition of an inverter 47, constituted by a PMOS transistor 48 and an NMOS transistor 49. The PMOS transistor 48 and the NMOS transistor 49 of the inverter 47 have gate terminals connected together and to the output Out' of the bit-control latch 41, and drain terminals connected together and to the respective bitline BL; moreover, the source terminal of the PMOS transistor 48 is connected to the bitline high-voltage line BLHV_line, whilst the source terminal of the NMOS transistor 49 is connected to the bitline reference line BLs_line. In this way, the bit-control latch 41 biases the respective bitline BL alternatively at the biasing voltage value received on the bitline high-voltage line BLHV_line or on the bitline reference line BLs_line (in either case, at a desired and controlled value).

The column-latch stage 24 moreover has a further input on which it receives column address signals Add_Col, on the basis of which the outputs Out' of the gate-control latch 40 and of the bit-control latch 41 are driven (in a way not described in detail herein).

In use, during an erasing operation, the management unit 28 of the charge-pump stage 22 is configured so as to supply the following voltage values on the output-biasing lines in order to implement the erasing biasing scheme described previously: the first high voltage $HV_{p1}$ on the first row high-voltage line HV1_line; the second high voltage $HV_{p2}$ on the second row high-voltage line HV2_line; the erasing voltage $V_{erase}$ on the gate-control high-voltage line CgHV_line; the gate-control reference voltage $V_{cgtr}$ on the gate-control reference line Cgs_line; and the row reference voltage $V_{SS}$ on the row reference line VSS_line. The bitline high-voltage line BLHV_line, the bitline reference line BLs_line, and the source-line reference line SLs_line are moreover set at the ground voltage (0 V).

During a programming operation, the management unit 28 of the charge-pump stage 22 is instead configured so as to supply the following voltage values on the output-biasing lines in order to implement the programming biasing scheme described previously: the first high voltage $HV_{p1}$ on the second row high-voltage line HV2_line; the second high voltage $HV_{p2}$ on the first row high-voltage line HV1_line; the programming voltage $V_{prog}$ on the bitline high-voltage line BLHV_line; the row reference voltage $V_{SS}$ on the row reference line VSS_line; and the clamp voltage $V_{clamp}$ both on the bitline reference line BLs_line and on the source-line reference line SLs_line. Furthermore, both the gate-control high-voltage line CgHV_line and the gate-control reference line Cgs_line are set at the ground voltage (0 V).

As it will be clear, the specific values of the biasing voltages used in the various biasing operations of the lines of the memory array 10 can vary with respect to what has been illustrated so far (for example, on account of the use of more scaled CMOS technologies or of a different type of memory cells). In this regard, it is emphasized that these different biasing-voltage values can be conveniently generated by the voltage regulator 27, via appropriate divisions of the same boosted voltage $HV_p$, and managed appropriately by the management unit 28.

In a further embodiment, for example, a lower value for the programming voltage $V_{prog}$ to be applied on the bitlines BL to be programmed is generated, for example equal to 12 V. It follows that on the gate terminal of the selection transistors 3 a lower voltage value is may be used for transferring this programming voltage $V_{prog}$ onto the drain terminal of the memory cells 2; in particular, the first high voltage $HV_{p1}$ to be used for programming operations has in this case a value of approximately 14 V. Similar values can be used for the erasing operations.

Figure 11:
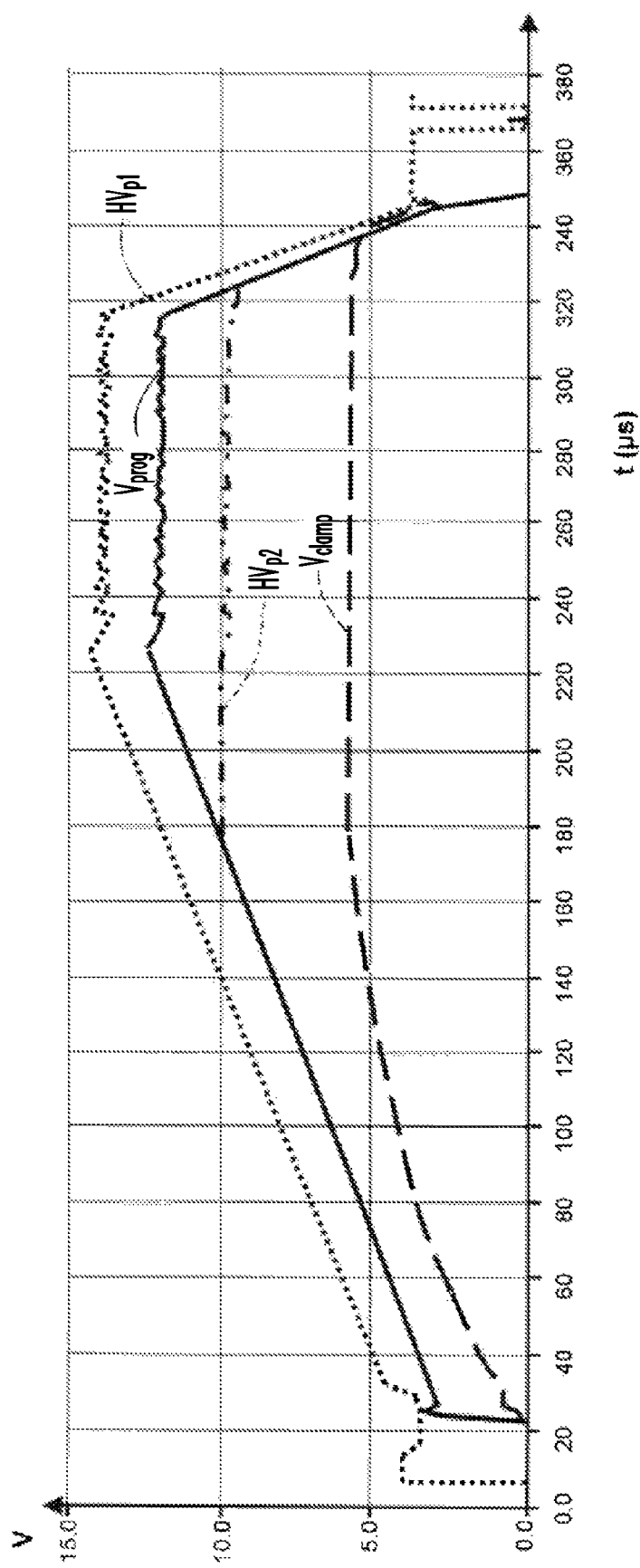
FIG. 11 shows a graph corresponding to the trend of biasing signals on the lines of the EEPROM array during a programming operation.

With reference to this further embodiment, FIG. 11 shows by way of example the plot of some of the biasing signals present on the lines of the memory array 10 during a programming operation, and in particular the plot of: the programming-voltage signal ($V_{prog}$) on a selected bitline BL (solid curve); the clamp-voltage signal ($V_{clamp}$) on a not selected bitline BL (dashed curve); the signal of the first high voltage ($HV_{p1}$) on a selected first wordline WL_seltr (dotted curve); and the signal of the second high voltage ($HV_{p2}$) on a selected second wordline WL_bsw (dashed-and-dotted curve). As may be noted, the values of the various biasing signals settle at the desired values (referred to in detail previously) after a corresponding initial ramp-rise phase (precharging), associated to the generation of the boosted voltage $HV_p$ (from which all the signals derive via respective divisions); the biasing signals maintain the desired values throughout the duration of the operating phase, in this case a programming phase.

The advantages that the biasing method and the associated EEPROM device afford emerge clearly from the foregoing discussion. It is once again emphasized in any case that the biasing scheme described herein for the operations of erasing and programming of an EEPROM array, combined with the appropriate modifications to the architecture of the corresponding EEPROM device, enables: reduction of the electrical stresses on the gate oxides both of the selection transistors and of the byte switches of the memory array, in this way limiting the increase of the transistor thresholds with the passing of time and the number of the work cycles (an increase that would jeopardize proper operation of the memory); elimination of the channel currents in the non-selected memory cells during a programming operation (hence eliminating trapping of charges and the consequent alteration of the threshold voltage); increase in the breakdown voltage level of the selection transistors and of the byte switches, with the consequent possibility of raising the maximum limit of the applicable programming and erasing voltages, without causing damage to the memory cells (and preventing harmful phenomena of soft-erasing and soft-programming).

In particular, the use of two distinct wordlines (WL-seltr and WL_bsw), each of which biased at an appropriate and controlled value according to the operating conditions of the memory array, enables avoiding using excessive voltages (which could cause electrical stresses) when not necessary.

It may be shown that the biasing architecture described herein enables cycling of each word of each row of the memory array up to 500 kcycles (corresponding to 750 s). For example, in an array having 32 words per row, 500 kcycles*2*32=32 Mcycles of erasings and programmings can thus be made (the factor 2 in the product takes in fact into account both the programming operations and the erasing operations).

To fully understand the advantages of this architecture, it may be considered that in memory arrays currently manufactured (in 0.13 μm CMOS technology), the maximum number of cycles obtainable (determined by the previously discussed drifts of the threshold voltages of the transistors on account of the electrical stresses) is 2.6 Mcycles.

Figure 12:
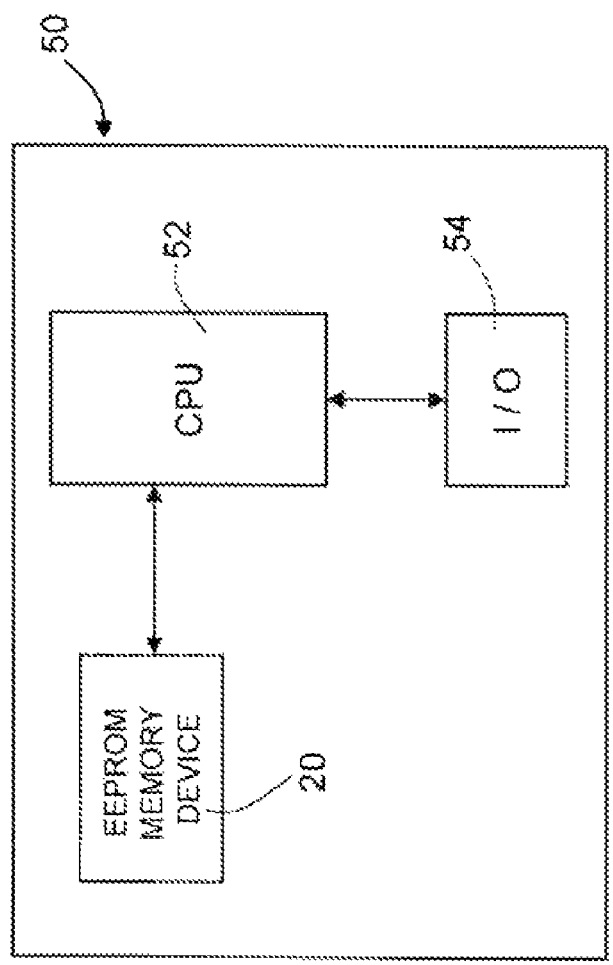
FIG. 12 is a general block diagram of an electronic device, in particular of a smart-card type, incorporating the EEPROM device of FIG. 10.

The listed characteristics render particularly advantageous the use of the described EEPROM device 20 in an electronic device, for example in a smartcard device 50, as illustrated in FIG. 12. Smartcards are portable microelectronic devices usually having the dimensions of a common credit card, normally made of plastic material, and incorporating a wide range of electronic subsystems that enable processing and storage of data.

Smartcard device 50 comprises for example: the EEPROM device 20, designed to store data for a wide range of uses (for example, for financial or security applications); a processing unit (for example, a microprocessor) 52, operatively coupled to the EEPROM device 20 for programming/erasing/reading of the data contained therein; and an I/O interface unit 54, operatively coupled to the microprocessor 52 itself and configured so as to enable communication of the smartcard device 50 with the outside world, for example with an external processing apparatus.

Finally, it is clear that modifications and variations may be made to what has been described and illustrated herein, without thereby departing from the scope of the present disclosure.

In particular, it has already been underlined that the specific values of the biasing voltages used in the different operations in the memory array may vary with respect to what has been illustrated (for example, on account of the use of different implementation technologies). For example, the values of the programming voltage $V_{prog}$ and of erasing voltage $V_{erase}$ could be in general comprised between 10 V and 15 V, and the high voltage values be different and sufficiently higher than these programming and erasing voltages to enable transfer thereof to the terminals of the memory cells.

The circuit structure of the means provided for generating and sending biasing voltages to the biasing lines of the memory array could differ from what has been illustrated herein.

Furthermore, the present biasing architecture could be applied also in different memory devices, for example ones having a different layout of the memory cells.

The various embodiments described above can be combined to provide further embodiments. Aspects of the embodiments can be modified, if necessary to employ concepts of the various patents, application and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
biasing an EEPROM array that includes a plurality of memory cells arranged in rows and columns, each of said memory cells having a first current-conduction terminal coupled to a bitline of said EEPROM array through a first switch and a control terminal coupled to a gate-control line of said memory array through a second switch, wherein a control terminal of the first switch is coupled to a first wordline and a control terminal of the second switch is coupled to a second wordline, the biasing including:
    selecting at least one memory cell for a memory operation, the memory operation being a programming operation or an erasing operation, the selecting including:
biasing the first wordline and the second wordline with voltages generated starting from an internal supply voltage, the biasing including biasing said first wordline and said second wordline with voltages different from one another and having values that are higher than said internal supply voltage and are a function of the memory operation for each of said operations of programming and erasing, said values being chosen in such a way as to limit electrical stresses in said EEPROM array.

2. The method of claim 1, wherein the biasing said first wordline and said second wordline comprises:
during said programming operation, biasing said first wordline at a first row-biasing voltage, higher than a programming voltage present on a bitline associated with said at least one memory cell, and biasing said second wordline at a second row-biasing voltage, lower than said first row-biasing voltage.

3. The method of claim 1, wherein the biasing said first wordline and said second wordline comprises:
during said erasing operation, biasing said second wordline at a first row-biasing voltage, higher than an erasing voltage present on a gate-control line associated with said at least one memory cell, and biasing said first wordline at a second row-biasing voltage, lower than said first row-biasing voltage.

4. The method of claim 3, wherein the selecting comprises:
generating a boosted voltage starting from said internal supply voltage; and
generating said first row-biasing voltage and said second row-biasing voltage as different divisions of said boosted voltage.

5. The method according to claim 3, further comprising:
biasing first wordlines and second wordlines associated with rows of said EEPROM array not selected for said memory operation at a row reference voltage, and wherein said second row-biasing voltage is higher than said row reference voltage.

6. The method according to claim 3, wherein said internal supply voltage is between 1 V and 1.35 V, said first row-biasing voltage is between 14 V and 16 V, and said second row-biasing voltage is between 8 V and 10 V.

7. The method according to claim 1, wherein memory cells of the plurality of memory cells belonging to a same row form, in groups, words, and associated with each row is a number of gate-control lines and wherein a number of second switches of the memory cells belonging to the same row is equal to the number of said words, each of said second switches of the memory cells belonging to the same row being configured to connect selectively to a respective gate-control line control terminals of memory cells of the same row that form a respective word, and wherein the selecting at least one memory cell further comprises biasing a gate-control line associated with the at least one memory cell, said method further comprising, during said erasing operation, biasing gate-control lines associated with memory cells not selected for said erasing operation at a control reference voltage of a non-zero positive value.

8. The method according to claim 7, wherein said control reference voltage is between 0 V and 5 V, and has a value to prevent one or more of: soft-programming and soft-erasing of said non-selected memory cells.

9. The method according to claim 1, wherein said memory cells each have a second current-conduction terminal connected to source lines of said EEPROM array electrically connected to one another, and wherein said selecting at least one memory cell further comprises biasing a bitline associated with the at least one memory cell, said method further comprising, during said programming operation:
biasing bitlines associated with non-selected memory cells that are not selected for said memory operation at a clamp voltage; and
biasing said source lines at the clamp voltage at which said bitlines associated with the non-selected memory cells are biased to inhibit a flow of current through said non-selected memory cells.

10. The method according to claim 9, wherein said clamp voltage is higher than said internal supply voltage.

11. The method according to claim 9, wherein said clamp voltage is between 3 V and 7 V.

12. The method according to claim 1, wherein said selecting comprises biasing a bitline associated with said at least one memory cell, a gate-control line associated with said at least one memory cell, the first wordline and the second wordline at voltages of a controlled and pre-set value, further comprising biasing other bitlines, other gate-control lines, other first wordlines and other second wordlines, each being of the EEPROM and not selected for said memory operation, at respective voltages of a controlled and pre-set value.

13. A memory device comprising:
an EEPROM array including:
- a plurality of memory cells arranged in rows and columns, each of said memory cells including a first current-conduction terminal and a control terminal;
- a plurality of first wordlines associated respectively with the rows;
- a plurality of second wordlines associated respectively with the rows;
- a plurality of bitlines associated respectively with the columns;
- a plurality of first switches respectively coupling the first current-conduction terminal of a corresponding one of the memory cells to a corresponding one of the bitlines, each first switch including a control terminal coupled to a corresponding one of the first wordlines;
- a gate-control line; and
- a plurality of second switches associated respectively with the rows, each second switch coupling the gate control line to the control terminals of at least some of the memory cells of the row associated with the second switch, each second switch including a control terminal coupled to a corresponding one of the second wordlines; and
- a row-biasing stage configured to bias the first wordline and the second wordline of a selected row for a memory operation, the memory operation being a programming operation or an erasing operation, with voltages generated starting from an internal supply voltage, wherein said row-biasing stage is configured to bias said first wordline and said second wordline with voltages that are higher than said internal supply voltage, are a function of the memory operation for each of said operations of programming and erasing, and are structured to limit electrical stresses in said EEPROM array.

14. The device of claim 13, wherein said row-biasing stage comprises:
- a level-shifter unit for each of said rows of said EEPROM array, said level-shifter unit including:
  - a first input connected to a first row supply line of the EEPROM array and configured to receive an input voltage of either a first row-biasing voltage or a second row-biasing voltage;
  - a second input connected to a row reference line of the EEPROM array and configured to receive a row reference voltage;
  - a first output configured to be selectively coupled to said first or said second inputs and is connected to a second wordline associated with a respective row level-shifter unit; and
  - a second output configured to be selectively coupled to said second input or said first input in response to said first output being coupled respectively to said first input or second input, and is connected to said first wordline associated with the respective row of the level-shifter unit by interposition of an inverter, wherein said inverter includes:
    - a supply input that is connected to a second row supply line, distinct from said first row supply line, and is configured to receive either the first row-biasing voltage or the second row-biasing voltage, that which is not received by the first input; and
    - a reference input that is connected to said row reference line and is configured to receive said row reference voltage.

15. The device of claim 14, further comprising:
- a charge-pump stage, configured to receive said internal supply voltage, and to generate a boosted voltage starting from said internal supply voltage and to generate said first row-biasing voltage and said second row-biasing voltage as different divisions of said boosted voltage, and to supply said first row-biasing voltage and second row-biasing voltage one of said first row-biasing voltage and second row-biasing voltage to said first row supply line, and one other of said first row-biasing voltage and second row-biasing voltage to said second row supply line.

16. The device of claim 13, wherein memory cells of the plurality of memory cells belonging a same row form, in groups, words, and associated with each row is a number of gate-control lines and wherein a number of second switches of the memory cells belonging to the same row is equal to the number of said words, each of said second switches of the memory cells belonging to the same row being configured to connect selectively to a respective gate-control line the control terminals of memory cells of the same row that form a respective word, the device further comprising a column-biasing stage, configured to bias, during said erasing operation, said number of gate-control lines at an erasing voltage, if said gate control lines are selected as a result of selection of a respective memory cell for said erasing operation, or at a control reference voltage of a non-zero positive value, as a result of non-selection of the respective memory cell for said erasing operation.

17. The device of claim 16, wherein said column-biasing stage comprises a column-latch unit for each of said number of gate-control lines, said column-latch unit having a loading input, a supply input, and an output connected to a respective gate-control line of said column-latch unit by interposition of an inverter, wherein said inverter has a supply input connected to a column-supply line on which said erasing voltage is configured to be present, and a reference input connected to a column reference line, on which said control reference voltage is configured to be present.

18. An electronic apparatus comprising:
a memory device; and
a control unit coupled to said memory device configured to manage corresponding memory operations of the memory device, the memory device comprising:
an EEPROM array including:
- a plurality of memory cells arranged in rows and columns, each of said memory cells including a first current-conduction terminal and a control terminal;
- a plurality of first wordlines associated respectively with the rows;
- a plurality of second wordlines associated respectively with the TOWS;
- a plurality of bitlines associated respectively with the columns;
- a plurality of first switches respectively coupling the first current-conduction terminal of a corresponding one of the memory cells to a corresponding one of the bitlines, each first switch including a control terminal coupled to a corresponding one of the first wordlines;
- a gate-control line; and
- a plurality of second switches associated respectively with the rows, each second switch coupling the gate control line to the control terminals of at least some of the memory cells of the row associated with the second switch, each second switch including a control terminal coupled to a corresponding one of the second wordlines; and
a row-biasing stage configured to bias the first wordline and the second wordline of a selected row for a memory operation, the memory operation being a programming operation or an erasing operation, with voltages generated starting from an internal supply voltage, wherein said row-biasing stage is configured to bias said first wordline and said second wordline with voltages that are higher than said internal supply voltage, are a function of the memory operation for each of said operations of programming and erasing, and are structured to limit electrical stresses in said EEPROM array.

19. The apparatus of claim 18, wherein the apparatus is smart-card.

20. The apparatus of claim 18, wherein said row-biasing stage comprises:
a level-shifter unit for each of said rows of said EEPROM array, said level-shifter unit including:
a first input connected to a first row supply line of the EEPROM array and configured to receive an input voltage of either a first row-biasing voltage or a second row-biasing voltage;
a second input connected to a row reference line of the EEPROM array and configured to receive a row reference voltage;
a first output configured to be selectively coupled to said first or said second inputs and is connected to a second wordline associated with a respective row level-shifter unit; and
a second output configured to be selectively coupled to said second input or said first input, in response to said first output being coupled respectively to said first input or second input, and is connected to said first wordline associated with the respective row of the level-shifter unit by interposition of an inverter, wherein said inverter includes:
a supply input that is connected to a second row supply line, distinct from said first row supply line, and is configured to receive either the first row-biasing voltage or the second row-biasing voltage, that which is not received by the first input; and
a reference input that is connected to said row reference line and is configured to receive said row reference voltage.

21. The apparatus of claim 20, further comprising:
a charge-pump stage, configured to receive said internal supply voltage, and to generate a boosted voltage starting from said internal supply voltage and to generate said first row-biasing voltage and said second row-biasing voltage as different divisions of said boosted voltage, and to supply said first row-biasing voltage and second row-biasing voltage, one of said first row-biasing voltage and second row-biasing voltage to said first row supply line, and one other of said first row-biasing voltage and second row-biasing voltage to said second row supply line.

22. The apparatus of claim 18, wherein memory cells of the plurality of memory cells belonging a same row form, in groups, words, and associated with each row is a number of gate-control lines and wherein a number of switches belonging to the same row is equal to the number of said words, each of said second switches of the memory cells belonging to the same row being configured to connect selectively to a respective gate-control line the control terminals of memory cells of the same row that form a respective word, the device further comprising a column-biasing stage, configured to bias, during said erasing operation, said number of gate-control lines at an erasing voltage, if said gate control lines are selected as a result of selection of a respective memory cell for said erasing operation, or at a control reference voltage, of a non-zero positive value, as a result of non-selection of the respective memory cell for said erasing operation.

23. An integrated circuit comprising:
a memory device; and
a control unit coupled to said memory device configured to manage corresponding memory operations of the memory device, the memory device comprising:
an EEPROM array including:
a plurality of memory cells arranged in rows and columns, each of said memory cells including a first current-conduction terminal and a control terminal;
a plurality of first wordlines associated respectively with the rows;
a plurality of second wordlines associated respectively with the TOWS;
a plurality of bitlines associated respectively with the columns;
a plurality of first switches respectively coupling the first current-conduction terminal of a corresponding one of the memory cells to a corresponding one of the bitlines, each first switch including a control terminal coupled to a corresponding one of the first wordlines;
a gate-control line; and
a plurality of second switches associated respectively with the rows, each second switch coupling the gate control line to the control terminals of at least some of the memory cells of the row associated with the second switch, each second switch including a control terminal coupled to a corresponding one of the second wordlines; and
a row-biasing stage configured to bias the first wordline and the second wordline of a selected row for a memory operation, the memory operation being a programming operation or an erasing operation, with voltages generated starting from an internal supply voltage, wherein said row-biasing stage is configured to bias said first wordline and said second wordline with voltages that are higher than said internal supply voltage, are a function of the memory operation for each of said operations of programming and erasing, and are structured to limit electrical stresses in said EEPROM array.

24. The integrated circuit of claim 23, wherein said row-biasing stage comprises:
a level-shifter unit for each of said rows of said EEPROM array, said level-shifter unit including:
a first input connected to a first row supply line of the EEPROM array and configured to receive an input voltage of either a first row-biasing voltage or a second row-biasing voltage;
a second input connected to a row reference line of the EEPROM array and configured to receive a row reference voltage;
a first output configured to be selectively coupled to said first or said second inputs and is connected to a second wordline associated with a respective row level-shifter unit; and
a second output configured to be selectively coupled to said second input or said first input, in response to said first output being coupled respectively to said first input or second input, and is connected to said first wordline associated with the respective row of the level-shifter unit by interposition of an inverter, wherein said inverter includes:
- a supply input that is connected to a second row supply line, distinct from said first row supply line, and is configured to receive either the first row-biasing voltage or the second row-biasing voltage, that which is not received by the first input; and
- a reference input that is connected to said row reference line and is configured to receive said row reference voltage.

25. The integrated circuit of claim 24, further comprising: a charge-pump stage, configured to receive said internal supply voltage, and to generate a boosted voltage starting from said internal supply voltage and to generate said first row-biasing voltage and said second row-biasing voltage as different divisions of said boosted voltage, and to supply said first row-biasing voltage and second row-biasing voltage, one of said first row-biasing voltage and second row-biasing voltage to said first row supply line, and one other of said first row-biasing voltage and second row-biasing voltage to said second row supply line.

26. The integrated circuit of claim 23, wherein memory cells of the plurality of memory cells belonging a same row form, in groups, words, and associated with each row is a number of gate-control lines and wherein a number of switches belonging to the same row is equal to the number of said words, each of said second switches of the memory cells belonging to the same row being configured to connect selectively to a respective gate-control line the control terminals of memory cells of the same row that form a respective word, the device further comprising a column-biasing stage, configured to bias, during said erasing operation, said number of gate-control lines at an erasing voltage, if said gate control lines are selected as a result of selection of a respective memory cell for said erasing operation, or at a control reference voltage, of a non-zero positive value, as a result of non-selection of the respective memory cell for said erasing operation.

* * * * *

UNITED STATES PATENT AND TRADEMARK OFFICE
CERTIFICATE OF CORRECTION

PATENT NO. : 8,376,237 B2
APPLICATION NO. : 12/885028
DATED : February 19, 2013
INVENTOR(S) : Gianbattista Lo Giudice et al.

It is certified that error appears in the above-identified patent and that said Letters Patent is hereby corrected as shown below:

In the Claims:

Column 16, Lines 52-53:
"a plurality of second wordlines associated respectively with the TOWS;" should read,
--a plurality of second wordlines associated respectively with the rows;--.

Column 18, Lines 21-22:
"a plurality of second wordlines associated respectively with the TOWS," should read,
--a plurality of second wordlines associated respectively with the rows;--.

Signed and Sealed this
Thirteenth Day of August, 2013

Teresa Stanek Rea
*Acting Director of the United States Patent and Trademark Office*